United States Patent
Lee et al.

(10) Patent No.: US 6,954,094 B2
(45) Date of Patent: Oct. 11, 2005

(54) SEMICONDUCTOR MEMORY DEVICE HAVING PARTIALLY CONTROLLED DELAY LOCKED LOOP

(75) Inventors: Jae-hyung Lee, Suwon (KR); Kyu-hyoun Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/645,018

(22) Filed: Aug. 21, 2003

(65) Prior Publication Data

US 2004/0042257 A1 Mar. 4, 2004

(30) Foreign Application Priority Data

Aug. 29, 2002 (KR) .................................. 10-2002-0051630

(51) Int. Cl.[7] .............................................. H03L 7/06
(52) U.S. Cl. ........................................ 327/158; 327/161
(58) Field of Search .................................. 327/156, 158, 327/159, 161

(56) References Cited

U.S. PATENT DOCUMENTS

| 6,337,589 B1 | 1/2002 | Ooishi .................... 327/156 |
| 6,492,852 B2 * | 12/2002 | Fiscus .................... 327/158 |
| 6,624,674 B1 * | 9/2003 | Zhao ...................... 327/156 |
| 6,753,812 B2 * | 6/2004 | Rabinowitz et al. ........ 342/464 |

FOREIGN PATENT DOCUMENTS

KR 2001-0064123 7/2001

* cited by examiner

Primary Examiner—Kenneth B. Wells
(74) Attorney, Agent, or Firm—Mills & Onello LLP

(57) ABSTRACT

A semiconductor memory device having a partially controlled delay locked loop includes a delay locked loop and a control signal generator. The control signal generator generates a first control signal and a second control signal, which are responsive to first through fifth mode selection signals for selecting operation modes of the semiconductor memory, device to partially turn the delay locked loop on or off. If the first control signal or the second control signal is activated, a portion of the delay locked loop to which the first or second control signal is applied is turned off. If the first control signal or the second control signal is deactivated, a portion of the delay locked loop to which the first or second control signal is applied is turned on. If the first mode selection signal is activated, only the second control signal is activated. If the second mode selection signal is activated, the first and second control signals are deactivated. If at least one of the third through fifth mode selection signals is activated, the first and second control signals are activated. Since the semiconductor memory device includes a built-in delay locked loop which is partially turned on or off, current consumption of the semiconductor memory device can be reduced.

22 Claims, 4 Drawing Sheets

SEMICONDUCTOR MEMORY DEVICE HAVING PARTIALLY CONTROLLED DELAY LOCKED LOOP

BACKGROUND OF THE INVENTION

This application claims the priority of Korean Patent Application No. 2002-51630, filed Aug. 29, 2002, in the Korean Intellectual Property Office, the disclosure of which is incorporated herein in its entirety by reference.

1. Field of the Invention

The present invention relates to a semiconductor memory device, and more particularly, to a semiconductor memory device having a delay locked loop which is partially turned on or off.

2. Description of the Related Art

Generally, a delay locked loop is utilized to receive an external clock signal generated by an external source and, in response, to output an internal clock signal having the same phase as the external clock signal. In a semiconductor memory device that operates in various operation modes, for example a DDR SDRAM (double data rate synchronous dynamic random access memory), a delay locked loop can be turned on or off in response to the lock time and operation speed of the delay locked loop, in order to reduce current consumption in the semiconductor memory device.

When a DDR SDRAM is first turned on, a phase of the delay locked loop is synchronized with an external clock signal after a predetermined time. Then, the delay locked loop can be turned off when the device is placed in a power-down mode, in order to reduce current consumption of the semiconductor memory device.

Subsequently, if the delay locked loop is turned on again, a phase of the output signal of the delay locked loop must, once again, be synchronized with the phase of the external clock signal. However, it takes time to synchronize the phase of the output signal of the delay locked loop with the phase of the external clock signal. Thus, it is difficult and inefficient to freely turn the delay locked loop on or off, in order to reduce the current consumption of the semiconductor memory device.

To solve the above-described problem, a method was proposed to store the synchronization information of an operating delay locked loop, prior to turning it off. Under this method, even if the delay locked loop is turned off and then on again, the internal signal of the delay locked loop having the same phase as an external clock signal can be readily output using the stored synchronization information. That is, the delay locked loop does not need to repeat the initial synchronization procedure performed when it was first turned on, and thus the time required for synchronizing the delay locked loop can be reduced.

However, even in the above case, the generation of the internal output signal of the delay locked loop can be limited by the self-delay of the delay locked loop according to the operation frequency of the delay locked loop; thus the operation of the delay locked loop must still be controlled according to the various operation modes of the semiconductor memory device.

In addition, in the case of turning the delay locked loop on or off in response to the operation mode of the semiconductor memory device, all portions of the delay locked loop are turned on or off. However, since some portions of the delay locked loop do not need to be turned on or off, turning all portions on or off unnecessarily increases the current consumption of the semiconductor memory device.

SUMMARY OF THE INVENTION

The present invention provides a semiconductor memory device having a delay locked loop which is partially turned on or off according to the operation mode of the semiconductor memory device.

According to an aspect of the invention, there is provided a semiconductor memory device comprising a delay locked loop and a control signal generator.

The control signal generator generates a first control signal and a second control signal, which are responsive to a plurality of, for example, first through fifth, mode selection signals for selecting operation modes of the semiconductor memory device, to partially turn the delay locked loop on or off.

If the first control signal or the second control signal is activated, a portion of the delay locked loop to which the first or second control signal is applied is turned off. If the first control signal or the second control signal is deactivated, a portion of the delay locked loop to which the first or second control signal is applied is turned on.

If the first mode selection signal is activated, only the second control signal is activated. If the second mode selection signal is activated, the first and second control signals are deactivated. If at least one of the third through fifth mode selection signals is activated, the first and second control signals are activated.

The control signal generator includes a first NOR gate for performing a NOR operation on the third through fifth mode selection signals, a second NOR gate for performing a NOR operation on the third and fourth mode selection signals, a third NOR gate for performing a NOR operation on the fifth and first mode selection signals, a fourth NOR gate for performing a NOR operation on outputs of the second and third NOR gates, a fifth NOR gate for performing a NOR operation on an output of the first NOR gate and the second mode selection signal to output the first control signal, and a sixth NOR gate for performing a NOR operation on an output of the fourth NOR gate and the second mode selection signal to output the second control signal.

If the first mode selection signal is activated, the semiconductor memory device is in an active-power-down mode, if the second mode selection signal is activated, the semiconductor memory device is in an active-standby mode, if the third mode selection signal is activated, the semiconductor memory device is in a precharge mode, if the fourth mode selection signal is activated, the semiconductor memory device is in a precharge-power-down mode, and if the fifth mode selection signal is activated, the semiconductor memory device is in a self-refresh mode.

According to another aspect of the invention, there is provided a semiconductor memory device comprising a delay locked loop, a mode selection signal generator and a control signal generator.

The mode selection signal generator generates first through fifth mode selection signals, which are responsive to operation control signals for controlling operations of the semiconductor memory device, to select operation modes of the semiconductor memory device.

The control signal generator generates a first control signal and a second control signal, which are responsive to the first through fifth mode selection signals to partially turn the delay locked loop on or off.

If at least one of the third through fifth mode selection signals is activated, both the first and second control signals are activated. If the first mode selection signal is activated, only the second control signal is activated. If the second mode selection signal is activated, the first and second control signals are deactivated.

The delay locked loop includes an input buffer, a first delay unit, a second delay unit, an output unit, and a compensation feedback unit.

The input buffer receives an external clock signal. The first and second delay units compare a phase of a signal output from the input buffer with a phase of a predetermined internal clock signal, and delay the output signal of the input buffer in response to the comparison result. The first and second delay units are serially connected with each other.

The output unit receives a signal output from the second delay unit, and outputs the received signal. The compensation feedback unit delays the output signal of the second delay unit for the same time as the output signal of the second delay unit by the output unit is delayed, and outputs the delayed signal as the internal clock signal.

If the first control signal and the second control signal are activated, the input buffer, the first and second delay units, the output unit, and the compensation feedback unit are all turned off. If the first control signal and the second control signal are deactivated, the input buffer, the first and second delay units, the output unit, and the compensation feedback unit are all turned on.

If only the second control signal is activated, the second delay unit, the output unit and the compensation feedback unit are turned off, and the input buffer and the first delay unit are all turned on. If only the second control signal is activated, the first delay unit, the second delay unit, the compensation feedback unit, and the output unit are turned off, and the input buffer is turned on.

The control signal generator includes a first NOR gate for performing a NOR operation on the third through fifth mode selection signals, a second NOR gate for performing a NOR operation on the third and fourth mode selection signals, a third NOR gate for performing a NOR operation on the fifth and first mode selection signals, a fourth NOR gate for performing a NOR operation on outputs of the second and third NOR gates, a fifth NOR gate for performing a NOR operation on an output of the first NOR gate and the second mode selection signal to output the first control signal, and a sixth NOR gate for performing a NOR operation on an output of the fourth NOR gate and the second mode selection signal to output the second control signal.

If the first mode selection signal is activated, the semiconductor memory device is in an active-power-down mode, if the second mode selection signal is activated, the semiconductor memory device is in an active-standby mode, if the third mode selection signal is activated, the semiconductor memory device is in a precharge mode, if the fourth mode selection signal is activated, the semiconductor memory device is in a precharge-power-down mode, and if the fifth mode selection signal is activated, the semiconductor memory device is in a self-refresh mode.

The operation control signals include a /CS (chip select) signal, a /CAS (column address strobe) signal, a /RAS (row address strobe) signal, a /WE (write enable) signal, and a CKE (clock enable) signal.

BRIEF DESCRIPTION OF THE DRAWINGS

The above and other aspects and advantages of the present invention will become more apparent by describing in detail preferred embodiments thereof with reference to the attached drawings in which.

DETAILED DESCRIPTION OF PREFERRED EMBODIMENTS

Figure 1:
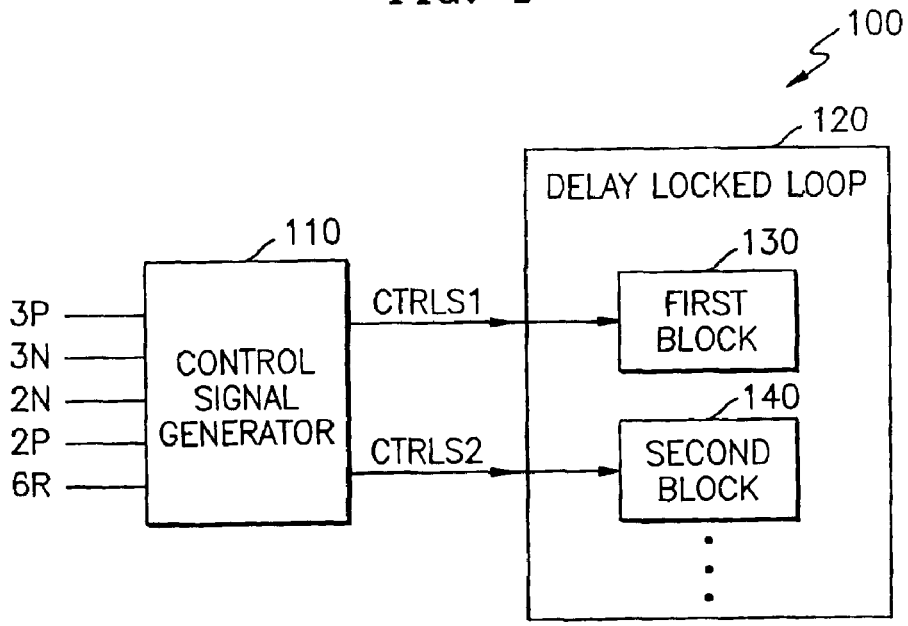
FIG. 1 is a block diagram of a semiconductor memory device according to a first embodiment of the present invention.

The present invention will now be described more fully with reference to the accompanying drawings, in which preferred embodiments of the invention are shown. When the same reference numeral appears in more than one drawing, it denotes the same element.

Figure 2:
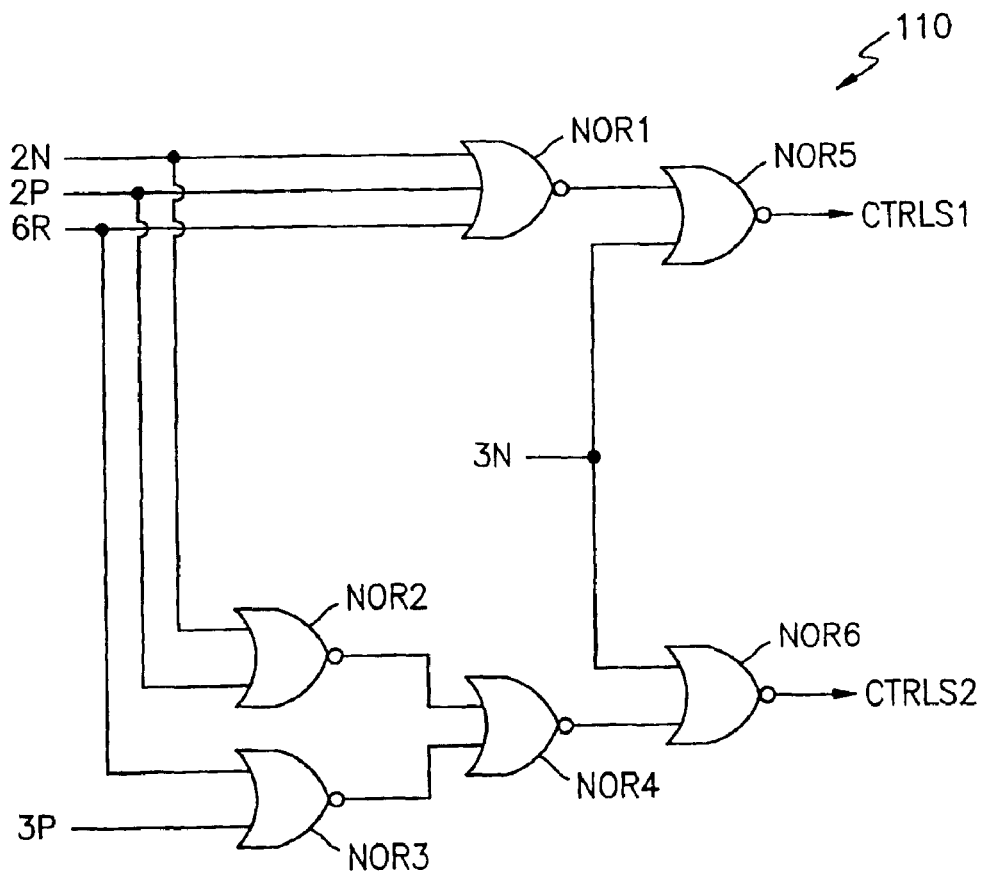
FIG. 2 is a detailed schematic diagram of the control signal generator of FIG. 1.

FIG. 1 is a block diagram of a semiconductor memory device according to a first embodiment of the present invention, and FIG. 2 is a detailed schematic diagram of the control signal generator of FIG. 1.

As shown in FIGS. 1 and 2, a semiconductor memory device 100 according to the first embodiment of the present invention includes a control signal generator 110 and a delay locked loop 120.

The control signal generator 110 generates a first control signal CTRLS1 and a second control signal CTRLS2, which are responsive to first through fifth mode selection signals 3P, 3N, 2N, 2P and 6R for selecting various operation modes of the semiconductor memory device 100, to partially turn the delay locked loop 120 on or off. The delay locked loop 120 is divided into a plurality of blocks, for example, a first block 130 and a second block 140, etc.

The first through fifth mode selection signals 3P, 3N, 2N, 2P and 6R are responsive to operation control signals (not shown) for controlling the operation of the semiconductor memory device 100 in order to select the operation mode of the semiconductor memory device 100.

More specifically, if the first mode selection signal 3P is activated, the semiconductor memory device 100 is in an active-power-down mode. If the second mode selection signal 3N is activated, the semiconductor memory device 100 is in an active-standby mode. If the third mode selection signal 2N is activated, the semiconductor memory device 100 is in a precharge mode. If the fourth mode selection signal 2P is activated, the semiconductor memory device 100 is in a precharge-power-down mode. If the fifth mode selection signal 6R is activated, the semiconductor memory device 100 is in a self-refresh mode.

If the first mode selection signal 3P is activated, only the second control signal CTRLS2 is activated. If the second mode selection signal 3N is activated, both the first and second control signals CTRLS1 and CTRLS2 are deactivated. If at least one of the third through fifth mode selection signals 2N, 2P and 6R is activated, both the first and second control signals CTRLS1 and CTRLS2 are activated.

As shown in FIG. 2, the above-described control signal generator 110 includes a first NOR gate NOR1 for performing a NOR operation on the third through fifth mode selection signals 2N, 2P and 6R, a second NOR gate NOR2 for performing a NOR operation on the third and fourth mode selection signals 2N and 2P, a third NOR gate NOR3 for performing a NOR operation on the fifth and first mode selection signals 6R and 3P, a fourth NOR gate NOR4 for performing a NOR operation on outputs of the second and third NOR gates NOR2 and NOR3, a fifth NOR gate NOR5 for performing a NOR operation on an output of the first NOR gate NOR1 and the second mode selection signal 3N to output the first control signal CTRLS1, and a sixth NOR gate NOR6 for performing a NOR operation on an output of the fourth NOR gate NOR4 and the second mode selection signal 3N to output the second control signal CTRLS2.

If the first control signal CTRLS1 or the second control signal CTRLS2 is activated, a portion of the delay locked loop 120 to which the first or second control signal CTRLS1 or CTRLS2 is applied is turned off. Further, if the first or second control signal CTRLS1 or CTRLS2 is deactivated, a portion of the delay locked loop 120 to which the first or second control signal CTRLS1 or CTRLS2 is applied is turned on.

Hereafter, the operation of the semiconductor memory device 100 according to the first embodiment of the present invention will be described in detail referring to FIGS. 1 and 2.

The semiconductor memory device 100 has various operation modes such as the active-standby mode, the active-power-down mode, the precharge mode, the precharge-power-down mode, and the self-refresh mode. If a power supply voltage is applied to the semiconductor memory device 100, the semiconductor memory device 100 passes through the precharge mode and the active-standby mode and then performs a read operation. After completing the read operation, the semiconductor memory device 100 returns to the precharge mode.

Before the semiconductor memory device 100 changes from operation under the precharge mode to operation under the active-standby mode, the semiconductor memory device 100 can pass through the self-refresh mode or the precharge-power-down mode. Further, the semiconductor memory device 100 can be moved from the active-standby mode to the active-power-down mode.

As described above, if the first mode selection signal 3P is activated, the semiconductor memory device 100 is in the active-power-down mode. If the second mode selection signal 3N is activated, the semiconductor memory device 100 is in the active-standby mode. If the third mode selection signal 2N is activated, the semiconductor memory device 100 is in the precharge mode. If the fourth mode selection signal 2P is activated, the semiconductor memory device 100 is in the precharge-power-down mode. If the fifth mode selection signal 6R is activated, the semiconductor memory device 100 is in the self-refresh mode.

Herein, in this example, if any of first through fifth mode selection signals 3P, 3N, 2N, 2P and 6R are logic 'high', this means that those mode selection signals are activated. Referring to FIG. 2, as described above, if the first mode selection signal 3P is activated, only the second control signal CTRLS2 is activated. If the second mode selection signal 3N is activated, the first and second control signals CTRLS1 and CTRLS2 are deactivated. If at least one of the third through fifth mode selection signals 2N, 2P and 6R is activated, the first and second control signals CTRLS1 and CTRLS2 are both activated.

One example of the control signal generator 110 is shown in FIG. 2, however, the control signal generator 110 is not limited this specific embodiment.

The delay locked loop 120 can always be turned off while operating in the precharge mode, the precharge-power-down mode, and the self-refresh mode of the semiconductor memory device 100. The delay locked loop 120 is always turned on while operating under the read operation mode of the semiconductor memory device 100. The delay locked loop 120 may be turned on or off while in the active standby mode and the active-power-down mode, as needed.

If the first or the second control signal CTRLS1 or CTRLS2 is activated, a portion of the delay locked loop 120, to which the first or second control signal CTRLS1 or CTRLS2 is applied, is turned off. Further, if the first or second control signal CTRLS1 or CTRLS2 is deactivated, a portion of the delay locked loop 120, to which the first or second control signal CTRLS1 or CTRLS2 is applied, is turned on.

If the first and second control signals CTRLS1 and CTRLS2 are activated, a subset or portion of the blocks of the delay locked loop 120, to which the first and second control signals CTRLS1 and CTRLS2 are applied, are turned off.

Thus, in the case where any one of the third through fifth mode selection signals 2N, 2P, and 6R indicate operation under the precharge mode, the precharge-power-down mode, and the self-refresh mode respectively of the semiconductor memory device 100, the first and second control signals CTRLS1 and CTRLS2 are activated and all the blocks of the delay locked loop 120 can be turned off by applying the first and second control signals CTRLS1 and CTRLS2 to all the blocks of the delay locked loop 120.

If the first control signal CTRLS1 or the second control signal CTRLS2 are again deactivated, blocks of the delay locked loop 120 to which the deactivated first control signal CTRLS1 or second control signal CTRLS2 is applied are once again turned on.

Thus, in the case where the second mode selection signal 3N indicating the active standby mode of the semiconductor memory device 100 is activated, both the first and second control signals CTRLS1 and CTRLS2 are deactivated and all the blocks of the delay locked loop 120 are again turned on by applying the deactivated first and second control signals CTRLS1 and CTRLS2 to all the blocks of the delay locked loop 120.

If only the second control signal CTRLS2 is activated, blocks of the delay locked loop 120 to which the activated second control signal CTRLS2 is applied are turned off.

Thus, in a case where the first mode selection signal 3P indicating operation in the active-power-down mode of the semiconductor memory device 100, the second control signal CTRLS2 is activated, and some blocks of the delay locked loop 120 (i.e. those connected to the CTRLS1 control signal) remain turned on, and the remaining blocks can be turned off by applying the second control signal CTRLS2 to those blocks of the delay locked loop 120.

That is, the delay locked loop 120 can be partially turned off in the active-power-down mode of the semiconductor memory device 100 by applying the second control signal CTRLS2 to only a subset, or portion of the blocks 130, 140 of the delay locked loop 120.

In the present invention, the determination of which blocks of the delay locked loop 120 are turned on or off occurs according to which blocks of the delay locked loop 120 the first and second control signals CTRLS1 and CTRLS2 are applied to. Thus, since the delay locked loop 120 can be partially turned on or off according to the various operation modes of the semiconductor memory device 100, the consumption power of the semiconductor memory device 100 can be reduced.

Figure 3:
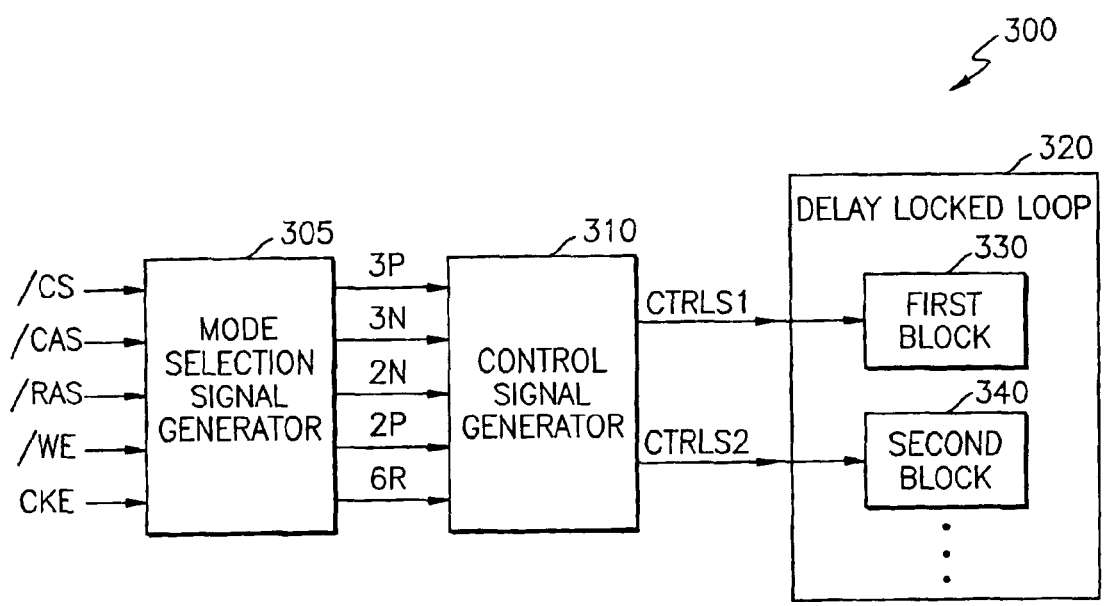
FIG. 3 is a block diagram of a semiconductor memory device according to a second embodiment of the present invention.
Figure 4:
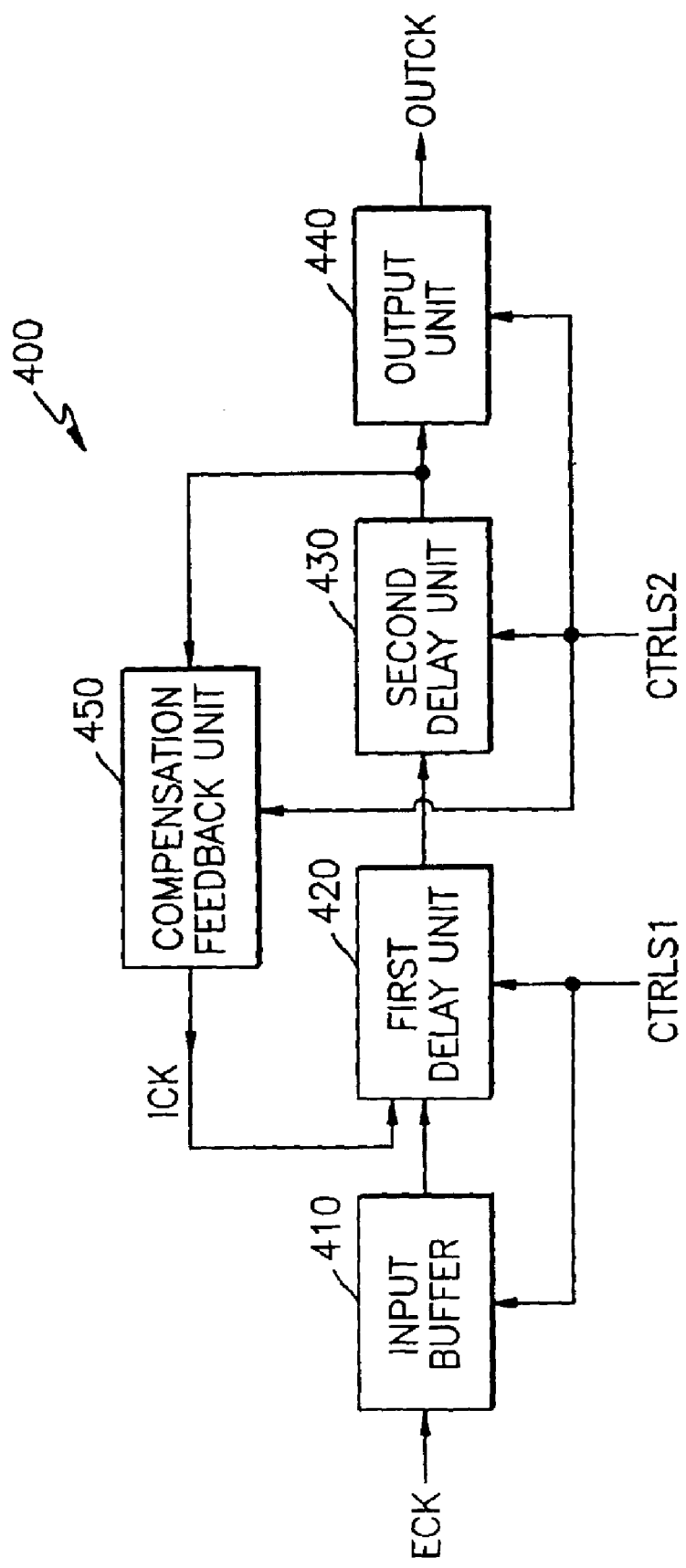
FIG. 4 is a block diagram of a first example of a partially controlled delay locked loop of FIG. 3.
Figure 5:
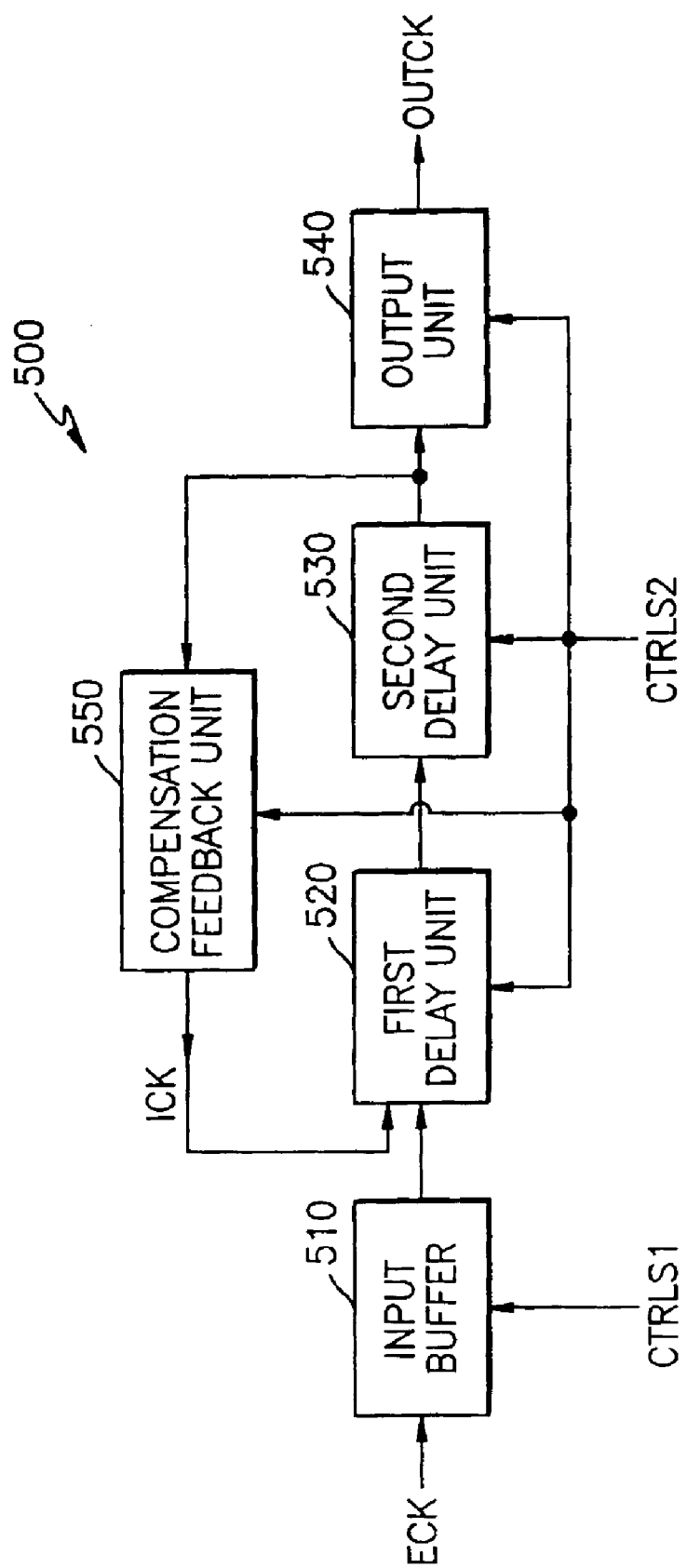
FIG. 5 is a block diagram of a second example of the partially controlled delay locked loop of FIG. 3.

FIG. 3 is a block diagram of a semiconductor memory device according to a second embodiment of the present invention, FIG. 4 shows a first example of a partially controlled delay locked loop of FIG. 3, and FIG. 5 shows a second example of the partially controlled delay locked loop of FIG. 3.

Referring to FIG. 3, a semiconductor memory device 300 according to the second embodiment of the present invention includes a delay locked loop 320, a mode selection signal generator 305, and a control signal generator 310.

The mode selection signal generator 305 generates first through fifth mode selection signals 3P, 3N, 2N, 2P and 6R, which are responsive to operation control signals for controlling operations of the semiconductor memory device 300 to select operation modes of the semiconductor memory device 300.

The operation control signals include a /CS (chip select) signal, a /CAS (column address strobe) signal, a /RAS (row address strobe) signal, a /WE (write enable) signal, and a CKE (clock enable) signal.

The control signal generator 310 generates a first control signal CTRLS1 and a second control signal CTRLS2, which are responsive to the first through fifth mode selection signals 3P, 3N, 2N, 2P and 6R, to partially turn the delay locked loop 320 on or off.

More specifically, as described above, if the first mode selection signal 3P is activated, the semiconductor memory device 300 is in an active-power-down mode. If the second mode selection signal 3N is activated, the semiconductor memory device 300 is in an active-standby mode. If the third mode selection signal 2N is activated, the semiconductor memory device 300 is in a precharge mode. If the fourth mode selection signal 2P is activated, the semiconductor memory device 300 is in a precharge-power-down mode. If the fifth mode selection signal 6R is activated, the semiconductor memory device 300 is in a self-refresh mode.

If the first mode selection signal 3P is activated, only the second control signal CTRLS2 is activated. If the second mode selection signal 3N is activated, both the first and second control signals CTRLS1 and CTRLS2 are deactivated. If at least one of the third through fifth mode selection signals 2N, 2P and 6R is activated, both the first and second control signals CTRLS1 and CTRLS2 are activated.

The above-described control signal generator 310 includes, for example, as shown in FIG. 2 above, a first NOR gate NOR1 for performing a NOR operation on the third through fifth mode selection signals 2N, 2P and 6R, a second NOR gate NOR2 for performing a NOR operation on the third and fourth mode selection signals 2N and 2P, a third NOR gate NOR3 for performing a NOR operation on the fifth and first mode selection signals 6R and 3P, a fourth NOR gate NOR4 for performing a NOR operation on outputs of the second and third NOR gates NOR2 and NOR3, a fifth NOR gate NOR5 for performing a NOR operation on an output of the first NOR gate NOR1 and the second mode selection signal 3N to output the first control signal CTRLS1, and a sixth NOR gate NOR6 for performing a NOR operation on an output of the fourth NOR gate NOR4 and the second mode selection signal 3N to output the second control signal CTRLS2.

Referring to FIGS. 4 and 5, delay locked loops 400 and 500 include input buffers 410 and 510, first delay units 420 and 520, second delay units 430 and 530, output units 440 and 450, and compensation feedback units 450 and 550.

Since the delay locked loops 400 and 500 of FIGS. 4 and 5 have the same structural elements, the delay locked loop 400 of FIG. 4 will be discussed in detail in the following description. The input buffer 410 receives an external clock signal ECK. The first and second delay units 420 and 430 compare the phase of a signal output from the input buffer 410 with the phase of a predetermined internal clock signal ICK, and delays the output signal of the input buffer 410 in response to the comparison result. The first and second delay units 420 and 430 are serially connected with each other.

The output unit 440 receives a signal output from the second delay unit 430, and outputs the received signal as an output clock signal OUTCK. The compensation feedback unit 450 delays the output signal of the second delay unit 430 for the same amount of time that the output signal of the second delay unit 430 is delayed by the output unit 440, and outputs the delayed signal as the internal clock signal ICK.

If both the first control signal CTRLS1 and the second control signal CTRLS2 are activated, the input buffer 410, the first and second delay units 420 and 430, the output unit 440, and the compensation feedback unit 450 are turned off. If both the first control signal CTRLS1 and the second control signal CTRLS2 are deactivated, the input buffer 410, the first and second delay units 420 and 430, the output unit 440, and the compensation feedback unit 450 are turned on.

In FIG. 4, if only the second control signal CTRLS2 is activated, the second delay unit 430, the output unit 440 and the compensation feedback unit 450 are turned off, and the input buffer 410 and the first delay unit 420 remain on.

In FIG. 5, if only the second control signal CTRLS2 is activated, the first delay unit 520, the second delay unit 530, the output unit 540, and the compensation feedback unit 550 are turned off, and the input buffer 510 remain on.

The operation of the semiconductor memory device 300 according to the second embodiment of the present invention will now be described in detail with reference to FIGS. 3 through 5.

The semiconductor memory device 300 shown in FIG. 3 further includes the mode selection signal generator 305 compared with the semiconductor memory device 100 shown in FIG. 1.

The mode selection signal generator 305 generates the first through fifth mode selection signals 3P, 3N, 2N, 2P and 6R, which are responsive to operation control signals for controlling the operation of the semiconductor memory device 300, to select the operation modes of the semiconductor memory device 300. As described above, the operation control signals include the /CS (chip select) signal, the /CAS (column address strobe) signal, the /RAS (row address strobe) signal, the /WE (write enable) signal, and the CKE (clock enable) signal.

It will be understood by those skilled in the art how the first through fifth mode selection signals 3P, 3N, 2N, 2P and 6R indicating the operation state of the semiconductor memory device 300 are generated by combining the operation control signals /CS /CAS, /RAS, /WE, and CKE. Thus, this will not be described herein.

Since the control signal generator 310 of FIG. 3 has the same circuit configuration as the control signal generator 110 of in FIG. 2, the relationship between the first through fifth mode selection signals 3P, 3N, 2N, 2P, and 6R and the first and second control signals CTRLS1 and CTRLS2 in the second embodiment of the present invention is the same as in the first embodiment of the present invention of the present invention. Thus, this will not be described herein.

The delay locked loop 320 is divided into a plurality of blocks 330, 340, etc. in order to be partially turned on or off.

Here, the delay locked loops 400 and 500 may include additional elements that are not shown in FIGS. 4 and 5.

The input buffer 410 receives the external clock signal ECK. The first and second delay units 420 and 430 compare the phase of the signal output from the input buffer 410 with the phase of the predetermined internal clock signal ICK, and delays the output signal of the input buffer 410 in response to the comparison result. The first and second delay units 420 and 430 are serially connected with each other.

Each of the first and second delay units 420 and 430 may comprise, for example, a variable delay line included in a general delay locked loop. The first and second delay units 420 and 430 delay the external clock signal ECK input from the input buffer 410 for a certain period of time. The delay times of the first and second delay units 420 and 430 are mutually different; that is, the maximum delay time of the first delay unit 420 is longer than that of the second delay unit 430.

The output unit 440 receives a signal output from the second delay unit 430, and outputs the received signal as an output clock signal OUTCK. The output signal of the output unit 440 is used, for example, as a reference clock in other circuits of the semiconductor memory device 300. The compensation feedback unit 450 delays the output signal of the second delay unit 430 for the same amount of time as the output signal of the second delay unit 430 is delayed by the output unit 440, and outputs the delayed signal as the internal clock signal ICK. Thus, in this manner, the phase of the clock signal OUTCK output by the output unit 440 can be synchronized with the phase of the external clock signal ECK.

Referring to FIG. 4, the delay locked loop 400 is divided into the plurality of blocks, that is, the input buffer 410, the first delay unit 420, the second delay unit 430, the output unit 440, and the compensation feedback unit 450. The first control signal CTRLS1 is applied to the input buffer 410 and the first delay unit 420. The second control signal CTRLS2 is applied to the second delay unit 430, the output unit 440, and the compensation feedback unit 450.

If the semiconductor memory device 300 is in any one of the precharge mode, the precharge-power-down mode, and the self-refresh mode, that is, if at least one of the third through fifth mode selection signals 2N, 2P and 6R is activated, the first control signal CTRLS1 and second control signal CTRLS2 are both activated. If the first control signal CTRLS1 and second control signal CTRLS2 are both activated, the input buffer 410, the first and second delay units 420 and 430, the output unit 440, and the compensation feedback unit 450 are turned off.

If the semiconductor memory device 300 is in an active-standby mode, that is, if the second mode selection signal 3N is activated, the first control signal CTRLS1 and second control signal CTRLS2 are both deactivated. If the first control signal CTRLS1 and second control signal CTRLS2 are both deactivated, the input buffer 410, the first and second delay units 420 and 430, the output unit 440, and the compensation feedback unit 450 are turned on.

If the semiconductor memory device 300 is in an active-power-down mode, that is, if the first mode selection signal 3P is activated, only the second control signal CTRLS2 is activated. If only the second control signal CTRLS2 is activated, the second delay unit 430, the output unit 440, and the compensation feedback unit 450, to which the second control signal CTRLS2 is applied, are turned off, and the input buffer 410 and the first delay unit 420, to which the first control signal CTRLS1 is applied, are turned on.

Referring to FIG. 5, if only the second control signal CTRLS2 is activated, the first delay unit 520, the second delay unit 530, the output unit 540, and the compensation feedback unit 550, to which the second control signal CTRLS2 is applied, are turned off, and the input buffer 510, to which the first control signal CTRLS1 is applied, is turned on.

According to the present invention, all the blocks of the delay locked loop are turned on in the active-standby mode, but a subset of the blocks of the delay locked loop can be selectively turned off while in the active-power-down mode. Although certain blocks of the delay locked loops 400 and 500 are shown in FIGS. 4 and 5 to be turned off by applying the second control signal CTRLS2, the blocks of the delay locked loops 400 and 500 that are turned off can be selected as needed.

As described above, since the semiconductor memory device according to the present invention includes a built-in delay locked loop which is partially turned on or off, the current consumption of the semiconductor memory device can be reduced.

While the present invention has been particularly shown and described with reference to preferred embodiments thereof, it will be understood by those of ordinary skill in the art that various changes in form and details may be made herein without departing from the spirit and scope of the present invention as defined by the appended claims.

What is claimed is:

1. A semiconductor memory device comprising:
   a delay locked loop that includes a first delay unit that compares a phase of an input external clock signal with a phase of an internal clock signal and delays the external clock signal to generate an intermediate clock signal in response to the comparison result, and a second delay unit that delays the intermediate clock signal, the first and second delay units being serially connected with each other; and
   a control signal generator that generates a first control signal at a first output and a second control signal at a second output independent of the first output, in response to a plurality of mode selection signals, each mode selection signal indicative of a mode of operation of the semiconductor memory device, the first and second control signals operative to turn corresponding first and second portions of the delay locked loop on or off.

2. The semiconductor memory device of claim 1, wherein if the first control signal or the second control signal is activated, the corresponding first or second portion of the delay locked loop to which the first or second control signal is applied is turned off.

3. The semiconductor memory device of claim 1, wherein if the first control signal or the second control signal is deactivated, the corresponding first or second portion of the delay locked loop to which the first or second control signal is applied is turned on.

4. The semiconductor memory device of claim 1, wherein if a first of the plurality of mode selection signals is activated, only the second control signal is activated.

5. The semiconductor memory device of claim 1, wherein if a second of the plurality of mode selection signals is activated, the first and second control signals are deactivated.

6. The semiconductor memory device of claim 1, wherein if at least one of a third through fifth of the plurality of mode selection signals is activated, the first and second control signals are activated.

7. The semiconductor memory device of claim 1, wherein the control signal generator includes;
a first NOR gate for performing a NOR operation on a third through fifth of the plurality of mode selection signals;
a second NOR gate for performing a NOR operation on a third and fourth of the plurality of mode selection signals;
a third NOR gate for performing a NOR operation on a fifth and first of the plurality of mode selection signals;
a fourth NOR gate for performing a NOR operation on outputs of the second and third NOR gates;
a fifth NOR gate for performing a NOR operation on an output of the first NOR gate and a second of the plurality of mode selection signals to output the first control signal; and
a sixth NOR gate for performing a NOR operation on an output of the fourth NOR gate and a second of the plurality of mode selection signals to output the second control signal.

8. The semiconductor memory device of claim 1, wherein if a first of the plurality of mode selection signals is activated, the semiconductor memory device is in an active-power-down mode, if a second of the plurality of mode selection signals is activated, the semiconductor memory device is in an active-standby mode, if a third of the plurality of mode selection signals is activated, the semiconductor memory device is in a precharge mode, if a fourth of the plurality of mode selection signals is activated, the semiconductor memory device is in a precharge-power-down mode, and if a fifth of the plurality of mode selection signals is activated, the semiconductor memory device is in a self-refresh mode.

9. A semiconductor memory device comprising:
a delay locked loop that includes: an input buffer that receives an external clock signal; first and second delay units that compare a phase of a signal output from the input buffer with a phase of an internal clock signal, and delay the output signal of the input buffer in response to the comparison result, the first and second delay units being serially connected with each other; an output unit that receives a signal output from the second delay unit, and outputs the received signal; and a compensation feedback unit that delays the output signal of the second delay unit for the same time as the output signal of the second delay unit is delayed by the output unit, and outputs the delayed signal as the internal clock signal;
a mode selection signal generator that generates a plurality of mode selection signals, each mode selection signal indicative of a mode of operation of the semiconductor memory device, the plurality of mode selection signals being generated in response to operation control signals for controlling operations of the semiconductor memory device; and
a control signal generator that generates a first control signal at a first output and a second control signal at a second output independent of the first output, in response to the plurality of mode selection signals, to turn corresponding first and second portions of the delay locked loop on or off.

10. The semiconductor memory device of claim 9, wherein if at least one of a third through fifth of the plurality of mode selection signals is activated, both the first and second control signals are activated.

11. The semiconductor memory device of claim 9, wherein if a first of the plurality of mode selection signals is activated, only the second control signal is activated.

12. The semiconductor memory device of claim 9, wherein if a second of the plurality of mode selection signals is activated, both the first and second control signals are deactivated.

13. The semiconductor memory device of claim 9, wherein if the first control signal and the second control signal are activated, the input buffer, the first and second delay units, the output unit, and the compensation feedback unit are all turned off.

14. The semiconductor memory device of claim 9, wherein if the first control signal and the second control signal are deactivated, the input buffer, the first and second delay units, the output unit, and the compensation feedback unit are all turned on.

15. The semiconductor memory device of claim 9, wherein if only the second control signal is activated, the second delay unit, the output unit and the compensation feedback unit are turned off and the input buffer and the first delay unit are all turned on.

16. The semiconductor memory device of claim 9, wherein if only the second control signal is activated, the first delay unit, the second delay unit, the compensation feedback unit, and the output unit are turned off and the input buffer is turned on.

17. The semiconductor memory device of claim 9, wherein the control signal generator includes:
a first NOR gate for performing a NOR operation on a third through fifth of the plurality of mode selection signals;
a second NOR gate for performing a NOR operation on third and fourth of the plurality of mode selection signals;
a third NOR gate for performing a NOR operation on fifth and first of the plurality of mode selection signals;
a fourth NOR gate for performing a NOR operation on outputs of the second and third NOR gates;
a fifth NOR gate for performing a NOR operation on an output of the first NOR gate and a second of the plurality of mode selection signals to output the first control signal; and
a sixth NOR gate for performing a NOR operation on an output of the fourth NOR gate and the second of the plurality of mode selection signals to output the second control signal.

18. The semiconductor memory device of claim 9, wherein if a first of the plurality of mode selection signals is activated, the semiconductor memory device is in an active-power-down mode, if a second of the plurality of mode selection signals is activated, the semiconductor memory device is in an active-standby mode, if a third of the plurality of mode selection signals is activated, the semiconductor memory device is in a precharge mode, if a fourth of the plurality of mode selection signals is activated, the semiconductor memory device is in a precharge-power-down mode, and if a fifth of the plurality of mode selection signals is activated, the semiconductor memory device is in a self-refresh mode.

19. The semiconductor memory device of claim 9, wherein the operation control signals include a /CS (chip select) signal, a /CAS (column address strobe) signal, a /RAS (row address strobe) signal, a /WE (write enable) signal, and a CKE (clock enable) signal.

20. A semiconductor memory device comprising:
a delay locked loop; and
a control signal generator that generates a first control signal and a second control signal, which are responsive to a plurality of mode selection signals for selecting operation modes of the semiconductor memory device, the first and second control signals to partially turn the delay locked loop on or off;

wherein if a first of the plurality of mode selection signals is activated, the semiconductor memory device is in an active-power-down mode, if a second of the plurality of mode selection signals is activated, the semiconductor memory device is in an active-standby mode, if a third of the plurality of mode selection signals is activated, the semiconductor memory device is in a precharge mode, if a fourth of the plurality of mode selection signals is activated, the semiconductor memory device is in a precharge-power-down mode, and if a fifth of the plurality of mode selection signals is activated, the semiconductor memory device is in a self-refresh mode.

21. A semiconductor memory device comprising:

a delay locked loop;

a mode selection signal generator that generates a plurality of mode selection signals, which are responsive to operation control signals for controlling operations of the semiconductor memory device, to select operation modes of the semiconductor memory device; and a control signal generator that generates a first control signal and a second control signal, which are responsive to the plurality of mode selection signals, to partially turn the delay locked loop on or off;

wherein if a first of the plurality of mode selection signals is activated, the semiconductor memory device is in an active-power-down mode, if a second of the plurality of mode selection signals is activated, the semiconductor memory device is in an active-standby mode, if a third of the plurality of mode selection signals is activated, the semiconductor memory device is in a precharge mode, if a fourth of the plurality of mode selection signals is activated, the semiconductor memory device is in a precharge-power-down mode, and if a fifth of the plurality of mode selection signals is activated, the semiconductor memory device is in a self-refresh mode.

22. A semiconductor memory device comprising:

a delay locked loop;

a mode selection signal generator that generates a plurality of mode selection signals, which are responsive to operation control signals for controlling operations of the semiconductor memory device, to select operation modes of the semiconductor memory device; and a control signal generator that generates a first control signal and a second control signal, which are responsive to the plurality of mode selection signals, to partially turn the delay locked loop on or off;

wherein the operation control signals include a /CS (chip select) signal, a /CAS (column address strobe) signal, a /RAS (row address strobe) signal, a /WE (write enable) signal, and a CKE (clock enable) signal.

* * * * *